(12) United States Patent
Chaki

(10) Patent No.: US 11,431,070 B2
(45) Date of Patent: Aug. 30, 2022

(54) FLEXIBLE SUBSTRATE

(71) Applicant: Mitsubishi Electric Corporation, Tokyo (JP)

(72) Inventor: Shin Chaki, Nagasaki (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/258,366

(22) PCT Filed: Nov. 22, 2018

(86) PCT No.: PCT/JP2018/043238
§ 371 (c)(1),
(2) Date: Jan. 6, 2021

(87) PCT Pub. No.: WO2020/105181
PCT Pub. Date: May 28, 2020

(65) Prior Publication Data
US 2021/0296750 A1 Sep. 23, 2021

(51) Int. Cl.
*H01P 3/08* (2006.01)
*H05K 1/02* (2006.01)

(52) U.S. Cl.
CPC .............. *H01P 3/08* (2013.01); *H05K 1/0237* (2013.01); *H05K 1/0277* (2013.01)

(58) Field of Classification Search
CPC ....... H01P 3/08; H05K 1/0237; H05K 1/0277
See application file for complete search history.

(56) References Cited

U.S. PATENT DOCUMENTS

| 2014/0176264 A1 | 6/2014 | Tago et al. |
| 2014/0176266 A1* | 6/2014 | Kato ............... H01P 3/088 333/238 |
| 2017/0025733 A1* | 1/2017 | Kato ............... H05K 1/0253 |

FOREIGN PATENT DOCUMENTS

| EP | 2574155 A1 | 3/2013 |
| JP | H04-22075 A | 1/1992 |
| JP | 2000-091801 A | 3/2000 |
| JP | 2007-123740 A | 5/2007 |
| JP | 2007-129111 A | 5/2007 |
| JP | 2012-253362 A | 12/2012 |
| JP | 2014-099657 A | 5/2014 |

(Continued)

OTHER PUBLICATIONS

International Search Report; Written Opinion; and Notification of Transmittal of the International Search Report and the Written Opinion of the International Searching Authority, or the Declaration issued in PCT/JP2018/043238; dated Feb. 19, 2019.

(Continued)

*Primary Examiner* — Samuel S Outten
(74) *Attorney, Agent, or Firm* — Studebaker & Brackett PC

(57) ABSTRACT

A flexible substrate (1) is bent at a bending part (2). A dielectric plate (3) has first and second main surfaces opposite to each other. A high-frequency signal line (4) is provided on the first main surface of the dielectric plate (3). A ground conductor (5) is provided on the second main surface of the dielectric plate (3). The high-frequency signal line (4) and the ground conductor (5) form a micro strip line. A local absent part (6) facing the high-frequency signal line (4) is provided on the ground conductor (5) only at the bending part (2).

3 Claims, 8 Drawing Sheets

(56) References Cited

FOREIGN PATENT DOCUMENTS

WO 2013/094471 A1 6/2013

OTHER PUBLICATIONS

Office Action issued in JP 2019-518327; mailed by the Japanese Patent Office dated Jun. 25, 2019.
Office Action issued in JP 2019-518327; mailed by the Japanese Patent Office dated Sep. 3, 2019.

* cited by examiner

FLEXIBLE SUBSTRATE

FIELD

The present disclosure relates to a flexible substrate.

BACKGROUND

Downsizing of a system including an optical communication transmission-reception module has been increasingly requested to achieve large capacity and speeding-up as well as space saving. Thus, along with a request for downsizing of a transmission-reception module package, a space for mounting the transmission-reception module in the system tends to decrease. Necessity for size reduction and a steep bending structure of a flexible substrate used for high-frequency signal input and output at the transmission-reception module has been increasing as well.

Various structures have been disclosed to achieve highly accurate control of characteristic impedance, reduction of unnecessary radiation, bending easiness, and the like of a flexible substrate (refer to Patent Literature 1, for example). However, a conventional flexible substrate is developed to achieve a characteristic impedance that does not change between a flat state and a bent state, and does not have an optimum characteristic impedance while being bent.

CITATION LIST

Patent Literature

[Patent Literature 1] JP 2007-123740 A

SUMMARY

Technical Problem

In a steep bending structure, bending is performed in a small range as compared to a conventional gradual bending structure. Thus, for example, when a micro strip line is used as a high-frequency signal line of a flexible substrate, the thickness of a dielectric changes due to steep bending, and accordingly, the characteristic impedance changes as well. This causes discontinuation between the characteristic impedance of a steep bending part and the characteristic impedance of a flat part. As a result, efficient high-frequency signal propagation cannot be achieved due to high-frequency signal reflection or loss generation at the steep bending part, which has been a problem. In particular, a passing loss is large in a case of propagation of a high-frequency signal at 10 GHz or higher. It is inevitable that the frequency of a high-frequency signal will be further increased due to a request for fast and large-capacity information propagation. Thus, significant influence will be caused by, for example, degradation of the performance of a high-frequency signal line included in a flexible substrate due to bending. This influence cannot be ignored to maintain high performance or achieve potential module performance at maximum.

The present invention is intended to solve the above-described problems and obtain a flexible substrate that can solve discontinuation between the characteristic impedance of a flat part and the characteristic impedance of a bending part.

Solution to Problem

A flexible substrate according to the present disclosure includes: a dielectric plate having first and second main surfaces opposite to each other, a high-frequency signal line provided on the first main surface of the dielectric plate; and a ground conductor provided on the second main surface of the dielectric plate, wherein the high-frequency signal line and the ground conductor form a micro strip line, and a local absent part facing the high-frequency signal line is provided on the ground conductor only at the bending part.

Advantageous Effects of Invention

In the present disclosure, a local absent part facing the high-frequency signal line is provided on the ground conductor only at the bending part. Accordingly, capacitance increase due to proximity of the high-frequency signal line and the ground conductor at the bending part can be prevented. That is, change of the local characteristic impedance of the bending part relative to the characteristic impedance of the flat part of the flexible substrate is compensated by the absent part. Thus, discontinuation between the characteristic impedance of the flat part of the flexible substrate and the characteristic impedance of the bending part can be prevented. As a result, it is possible to reduce signal reflection as well as a passing loss, and thus it is possible to reliably and efficiently propagate a high-frequency signal of an optical communication transmission-reception module.

DESCRIPTION OF EMBODIMENTS

A flexible substrate according to the embodiments of the present disclosure will be described with reference to the drawings. The same components will be denoted by the same symbols, and the repeated description thereof may be omitted.

Embodiment 1

Figure 1:
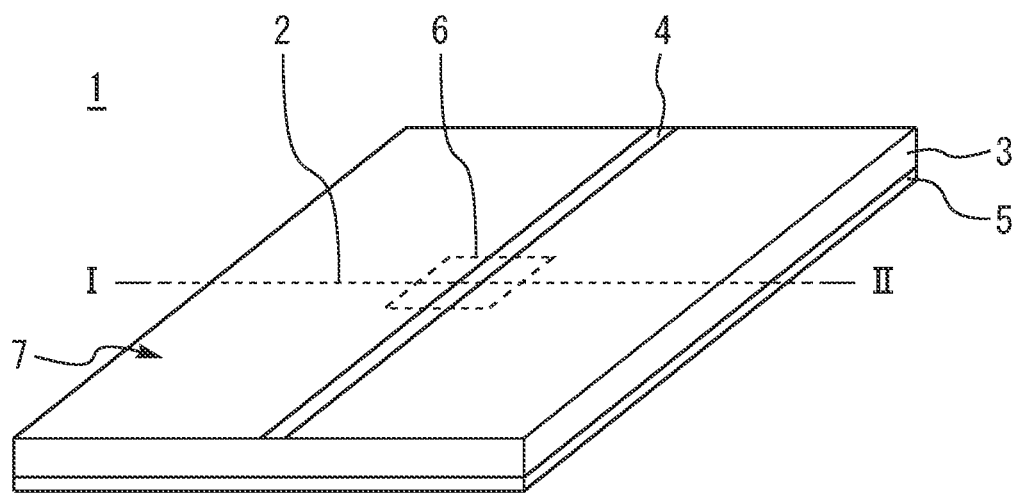
FIG. 1 is a perspective view illustrating a flexible substrate according to Embodiment 1.
Figure 2:
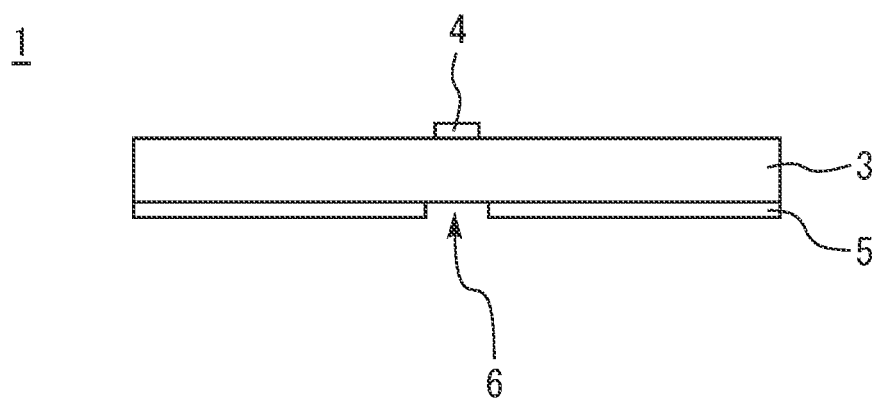
FIG. 2 is a cross-sectional view taken along line I-II in FIG. 1.

FIG. 1 is a perspective view illustrating a flexible substrate according to Embodiment 1. FIG. 2 is a cross-sectional view taken along line I-II in FIG. 1. This flexible substrate 1 is used to, for example, electrically connect an optical communication transmission-reception module package and a higher-level system. The flexible substrate 1 is bent at a bending part 2 along line I-II, but FIGS. 1 and 2 illustrate a state in which the flexible substrate 1 is not bent.

A dielectric plate 3 has first and second main surfaces opposite to each other. A high-frequency signal line 4 is provided on the first main surface of the dielectric plate 3. A ground conductor 5 is provided on the second main surface of the dielectric plate 3. The high-frequency signal line 4 and the ground conductor 5 form a micro strip line. A local absent part 6 facing the high-frequency signal line 4 is provided on the ground conductor 5 only at the bending part 2. The absent part 6 has a structure of a window shape in which the ground conductor 5 is absent. When a plurality of bending parts 2 exists, one absent part 6 is provided for each bending part 2.

Figure 3:
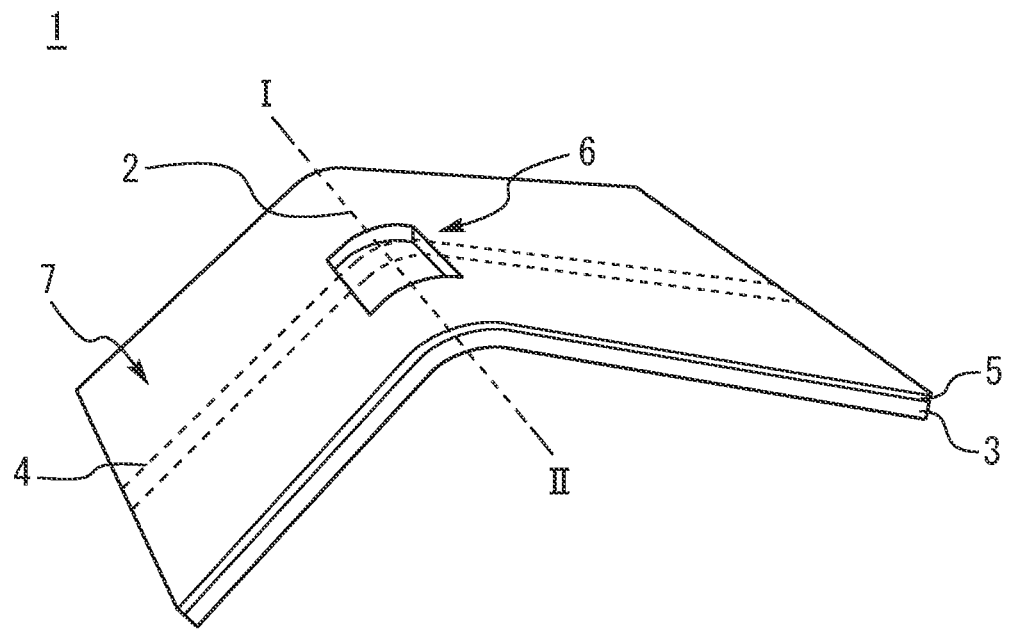
FIG. 3 is a perspective view illustrating a state in which the flexible substrate according to Embodiment 1 is bent.
Figure 4:
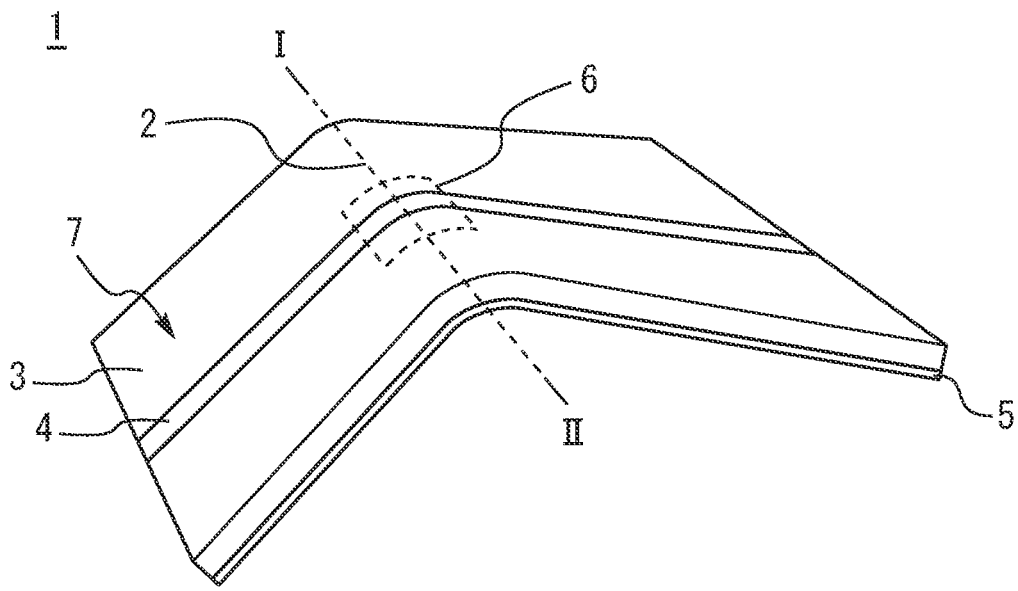
FIG. 4 is a perspective view illustrating a state in which the flexible substrate according to Embodiment 1 is bent.
Figure 5:
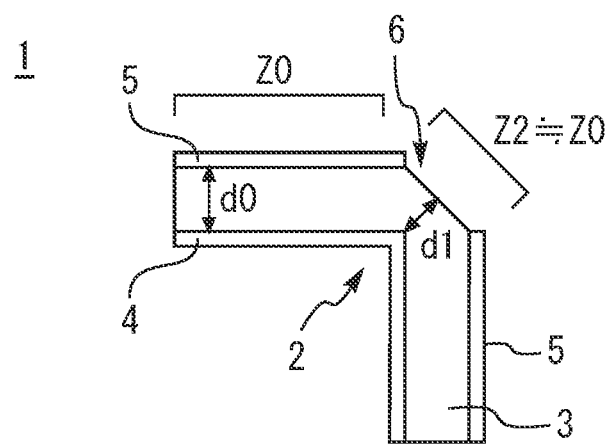
FIG. 5 is an enlarged cross-sectional view of a bending part in FIG. 3.

FIGS. 3 and 4 are perspective views illustrating a state in which the flexible substrate according to Embodiment 1 is bent. FIG. 5 is an enlarged cross-sectional view of a bending part in FIG. 3. FIG. 3 illustrates a case of bending in a convex shape on the ground conductor 5 side, and FIG. 4 illustrates a case of bending in a convex shape on the high-frequency signal line 4 side. In any case, the thickness of the dielectric plate 3 decreases when the flexible substrate 1 is bent. The relation d0>d1 holds, where do represents the thickness of the dielectric plate 3 at a flat part 7 of the flexible substrate 1 and d1 represents the minimum thickness of the dielectric plate 3 at the bending part 2 of the flexible substrate 1 being bent at 90°.

Figure 6:
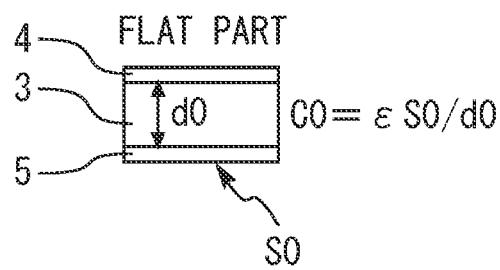
FIG. 6 is an enlarged cross-sectional view of the flat part and the bending part of the flexible substrate according to Embodiment 1.
Figure 6:
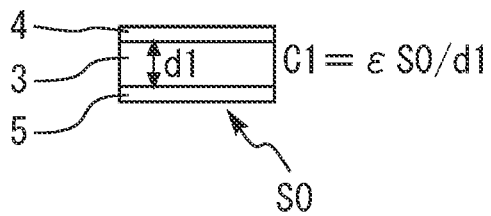
Figure 6:
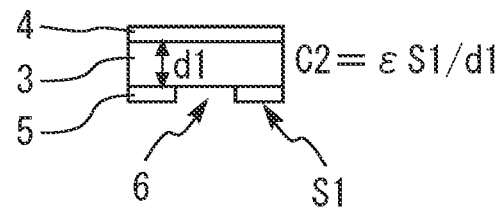

FIG. 6 is an enlarged cross-sectional view of the flat part and the bending part of the flexible substrate according to Embodiment 1. The capacitance of a metal-insulator-metal (MIM) structure is proportional to the area of a conductor and inversely proportional to the thickness of a dielectric. Capacitance C0 between the high-frequency signal line 4 and the ground conductor 5 at the flat part 7 is $C0=\varepsilon S0/d0$, where S0 represents the area of a conductor at flat part 7 or the bending part 2 at which no absent part 6 exists. Capacitance C1 at the bending part 2 at which no absent part 6 exists is $C1=\varepsilon S0/d1$. Since $d0>d1$, $C0<C1$ holds. Thus, capacitance of the flat part 7 is different from capacitance of the bending part 2 at which no absent part 6 exists. Capacitance C2 at the bending part 2 at which the absent part 6 exists is $C2=\varepsilon S1/d1$, where S1 represents the area of a conductor at this bending part 2. Since $S1<S0$, $C0≈C2$ holds.

Thus, capacitance of the flat part 7 is substantially equal to capacitance of the bending part 2 at which the absent part 6 exists.

The characteristic impedance of the high-frequency signal line 4 at the flat part 7 is represented by Z0. The characteristic impedance of the high-frequency signal line 4 at the bending part 2 of the flexible substrate 1 being bent is represented by Z1 when no absent part 6 exists or by Z2 when the absent part 6 exists. The relational expression $Z=\sqrt{(L/C)}$ holds, where Z represents the characteristic impedance, L represents the inductance of the high-frequency signal line 4, and C represents the capacitance between the high-frequency signal line 4 and the ground conductor 5. When the above-described capacitance relation is applied to the relational expression, $Z0>Z1$ and $Z0≈Z2$ hold. This indicates that discontinuation between the characteristic impedance of the flat part 7 and the characteristic impedance of the bending part 2 in the flexible substrate 1 can be prevented when the absent part 6 is provided. Optimum values need to be selected as the dimensions of the absent part 6 in accordance with the change amount of the thickness of the dielectric plate 3 due to bending, the relative permittivity of the dielectric plate 3, the bending angle, the frequency of a propagating high-frequency signal, and the like.

Figure 7:
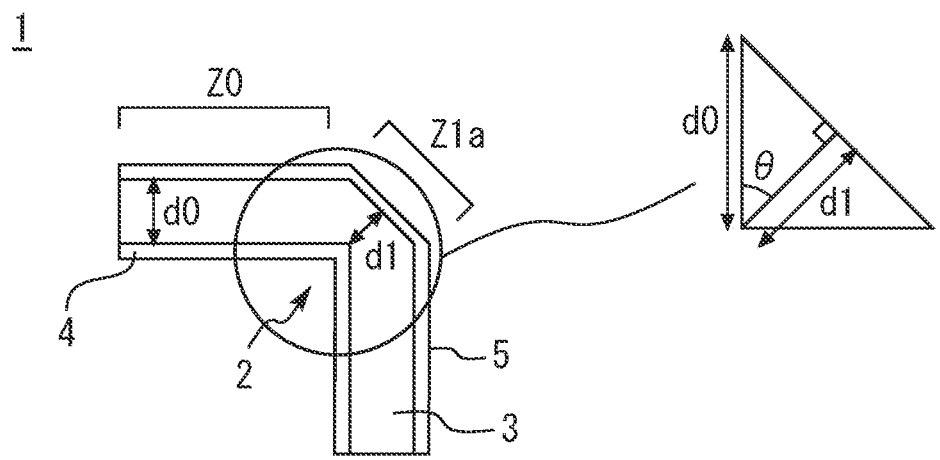
FIG. 7 is an enlarged cross-sectional view of a bending part of a flexible substrate according to a comparative example.
Figure 8:
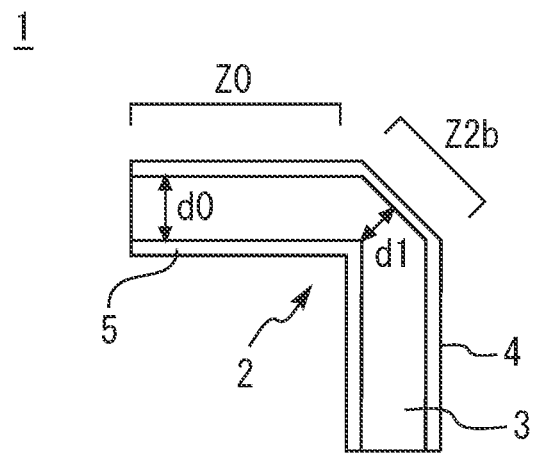
FIG. 8 is an enlarged cross-sectional view of a bending part of a flexible substrate according to a comparative example.

FIGS. 7 and 8 are enlarged cross-sectional views of a bending part of a flexible substrate according to a comparative example. FIG. 7 illustrates a case of bending in a convex shape on the ground conductor 5 side, and FIG. 8 illustrates a case of bending in a convex shape on the high-frequency signal line 4 side. No absent part 6 is provided in the comparative example. The ratio d1/d0 is given by cos θ. The relation d1/d0≈0.71 holds when the bending angle is 90° and θ is 45°. Characteristic impedances Z1a and Z2b at the bending part 2 in FIGS. 7 and 8 are $Z1a≈Z2b≈35.5Ω$. Characteristic impedance Z0 of the flat part 7 is normally designed to be 50Ω but is 50Ω or smaller at the bending part 2 of the comparative example. Thus, discontinuation of the characteristic impedance occurs in the comparative example, and accordingly, RF reflection occurs, which leads to a large passing loss.

However, in the present embodiment, the local absent part 6 facing the high-frequency signal line 4 is provided on the ground conductor 5 only at the bending part 2. Accordingly, capacitance increase due to proximity of the high-frequency signal line 4 and the ground conductor 5 at the bending part 2 can be prevented. That is, change of the local characteristic impedance of the bending part 2 relative to the characteristic impedance of the flat part 7 of the flexible substrate 1 is compensated by the absent part 6. Thus, discontinuation between the characteristic impedance of the flat part 7 of the flexible substrate 1 and the characteristic impedance of the bending part 2 can be prevented. As a result, it is possible to reduce signal reflection as well as a passing loss, and thus it is possible to reliably and efficiently propagate a high-frequency signal of an optical communication transmission-reception module.

In the present embodiment, one high-frequency signal line 4 is provided to the flexible substrate 1, but a plurality of high-frequency signal lines 4 may be provided and a DC line may be provided with diem. The flexible substrate 1 is not limited to a single layer structure but may have a multi-layer structure. A plurality of bending parts 2 may be provided and may include the bending part 2 having an opposite bending direction.

Embodiment 2

Figure 9:
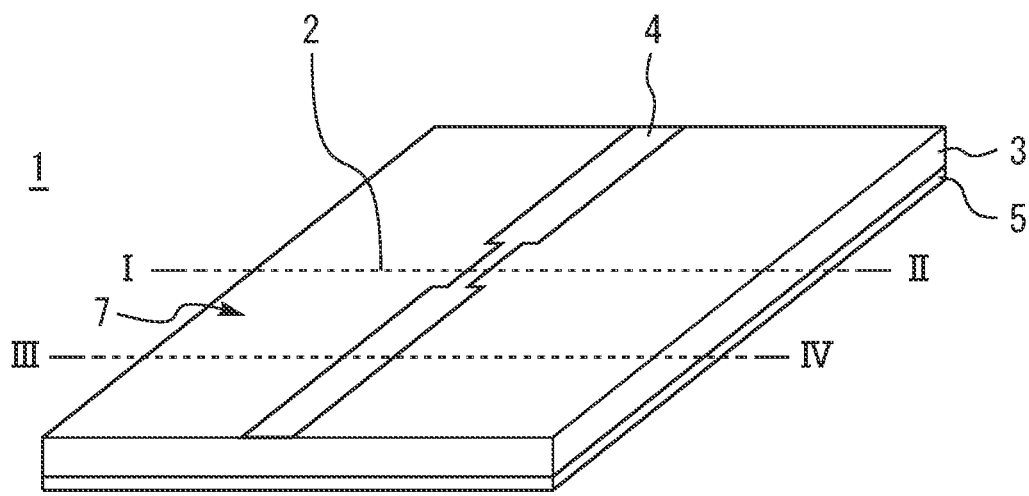
FIG. 9 is a perspective view illustrating a flexible substrate according to Embodiment 2.
Figure 10:
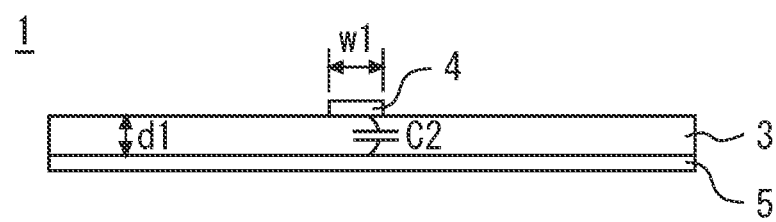
FIG. 10 is a cross-sectional view of the flexible substrate in FIG. 9 being bent, which is taken along I-II.
Figure 11:
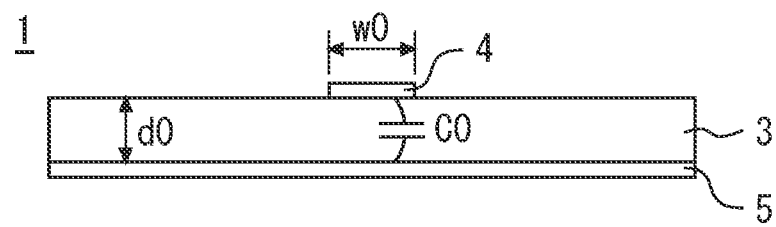
FIG. 11 is a cross-sectional view of the flexible substrate in FIG. 9 being flat, which is taken along III-IV.

FIG. 9 is a perspective view illustrating a flexible substrate according to Embodiment 2. FIG. 10 is a cross-sectional view of the flexible substrate in FIG. 9 being bent, which is taken along I-II. FIG. 11 is a cross-sectional view of the flexible substrate in FIG. 9 being flat, which is taken along III-IV. The width of the high-frequency signal line 4 is locally small only at the bending part 2 along I-II.

While the flexible substrate 1 is bent, a thickness d1 of the dielectric plate 3 of the bending part 2 is smaller than a thickness d0 of the dielectric plate 3 of the flat part 7 (d1<d0). Accordingly, the capacitance C1 between the high-frequency signal line 4 and the ground conductor 5 at the bending part 2 is larger than the capacitance C0 at the flat part 7 (C1>C0).

The characteristic impedance is determined by a ratio of capacitance and inductance L. The inductance L corresponds to the line width of the high-frequency signal line 4. Thus, in the present embodiment, a width w1 of the high-frequency signal line 4 at the bending part 2 is set to be locally smaller than a width w0 at the flat part 7 (w1<w0). Inductance L1 of the bending part 2 is larger than inductance L0 of the flat part 7 (L1>L0). Change of the local characteristic impedance of the bending part 2 relative to the characteristic impedance of the flat part 7 in the flexible substrate 1 is compensated by the locally increased inductance L1 of the bending part 2. Accordingly, discontinuation between the characteristic impedance Z0 of the flat part 7 and the characteristic impedance Z1 of the bending part 2 in the flexible substrate 1 can be solved (Z1≈Z0). An optimum value needs to be selected as the width w1 of the high-frequency signal line 4 at the bending part 2 in accordance with the change amount of the thickness of the dielectric plate 3 due to bending, the relative permittivity of the dielectric plate 3, the bending angle, the frequency of a propagating high-frequency signal, and the like.

Embodiment 3

Figure 12:
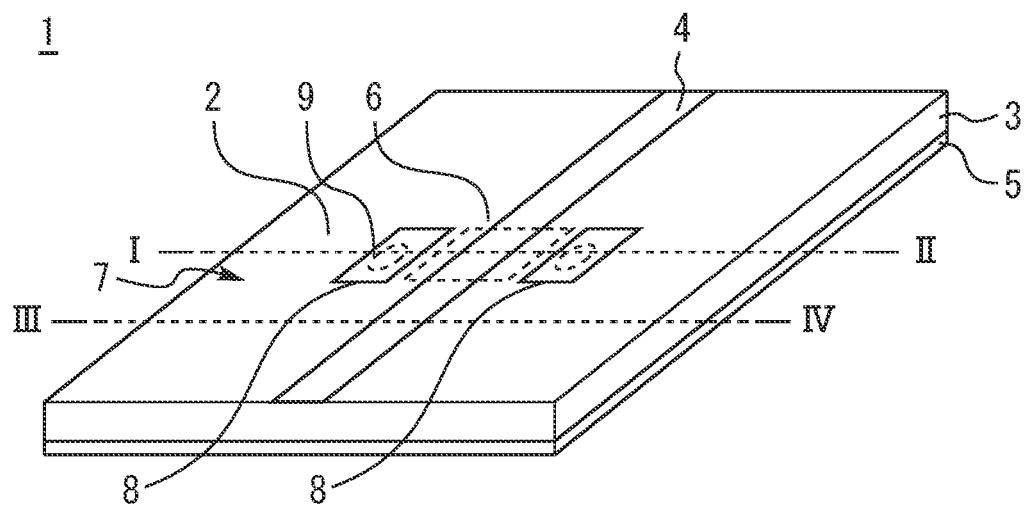
FIG. 12 is a perspective view illustrating a flexible substrate according to Embodiment 3.
Figure 13:
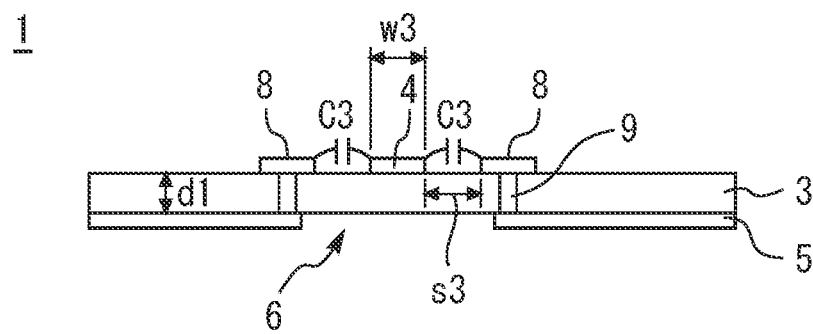
FIG. 13 is a cross-sectional view of the flexible substrate in FIG. 12 being bent, which is taken along I-II.
Figure 14:
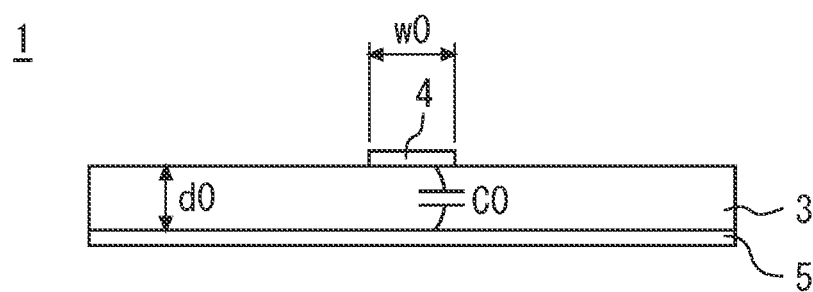
FIG. 14 is a cross-sectional view of the flexible substrate in FIG. 12 being flat, which is taken along III-IV.

FIG. 12 is a perspective view illustrating a flexible substrate according to Embodiment 3. FIG. 13 is a cross-sectional view of the flexible substrate in FIG. 12 being bent, which is taken along I-II. FIG. 14 is a cross-sectional view of the flexible substrate in FIG. 12 being flat, which is taken along III-IV.

Similarly to Embodiment 1, the absent part 6 facing the high-frequency signal line 4 is locally provided on the ground conductor 5 only at the bending part 2. Ground conductors 8 are locally provided on sides of the high-frequency signal line 4 only at the bending part 2. The ground conductor 5 and each ground conductor 8 are electrically connected with each other through a via 9 penetrating through the dielectric plate 3.

The high-frequency signal line 4 and the ground conductor 5 form a micro strip line at the flat part 7. The high-frequency signal line 4 and the ground conductors 8 form a coplanar line at the bending part 2.

At the bending part 2, the thickness of the dielectric plate 3 is small but the absent part 6 is provided, and thus, influence of the thickness of the dielectric plate 3 on the characteristic impedance of the bending part 2 is negligible. A characteristic impedance Z3 of the bending part 2 included in the coplanar line is determined by a width w3 of the high-frequency signal line 4 of a planar line, an interval s3 between the high-frequency signal line 4 and each ground conductor 8, and the permittivity of the dielectric plate 3. Influence of the permittivity of the dielectric plate 3 is dominant at a surface layer part.

Thus, a distance s3 between the high-frequency signal line 4 and each ground conductor 8 is set to be sufficiently smaller than the distance between the high-frequency signal line 4 and the ground conductor 5. Accordingly, change of the local characteristic impedance of the bending part 2 relative to the characteristic impedance of the flat part 7 in the flexible substrate 1 is compensated. Thus, discontinuation between the characteristic impedance of the flat part 7 and the characteristic impedance of the bending part 2 in the flexible substrate 1 can be solved.

In addition, since the ground conductors 8 are provided, a bent shape can be easily maintained. Thus, a stable high frequency characteristic can be obtained against external force at installation or stress on the flexible substrate 1 due to temperature change or the like.

Optimum values need to be selected as the dimensions of the absent part 6, the width w3 of the high-frequency signal line 4 of the coplanar line, the interval s3 between the high-frequency signal line 4 and each ground conductor 8, and the like in accordance with the change amount of the thickness of the dielectric plate 3 due to bending, the relative permittivity of the dielectric plate 3, the bending angle, the frequency of a high-frequency signal propagating, and the like.

Figure 15:
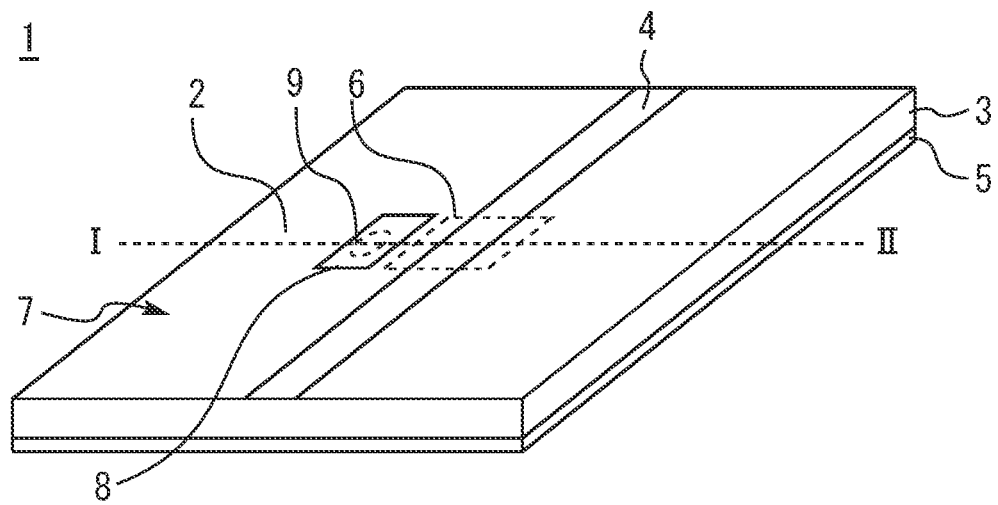
FIG. 15 is a perspective view illustrating a modification of the flexible substrate according to Embodiment 3.

FIG. 15 is a perspective view illustrating a modification of the flexible substrate according to Embodiment 3. A ground conductor 8 forming a coplanar line is provided only on one side of the high-frequency signal line 4. In actual wiring, a plurality of high-frequency signal lines 4 are provided in a limited space in some cases. In such a case, when the ground conductor 8 is provided only on one side of the high-frequency signal line 4, space saving can be achieved, and constraints on disposition of other wires can be reduced. Other configurations and effects are same as those of Embodiment 3.

Embodiment 4

Figure 16:
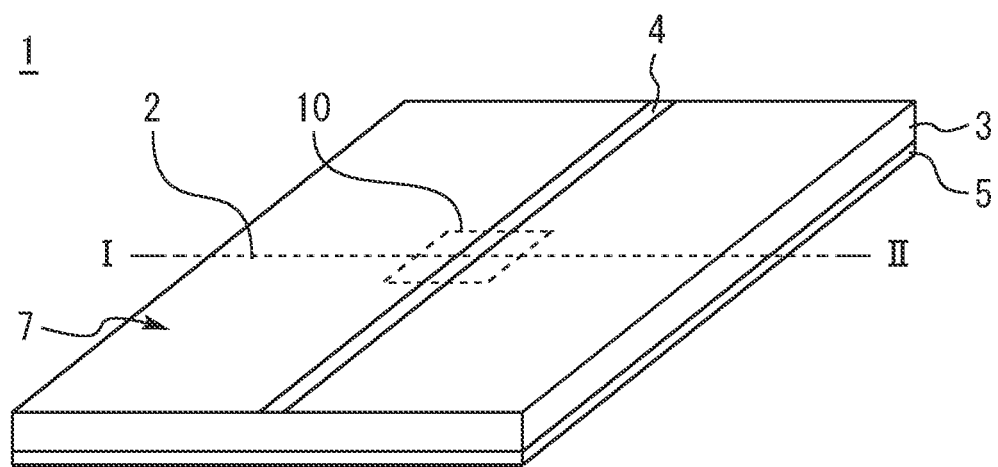
FIG. 16 is a perspective view illustrating a flexible substrate according to Embodiment 4.
Figure 17:
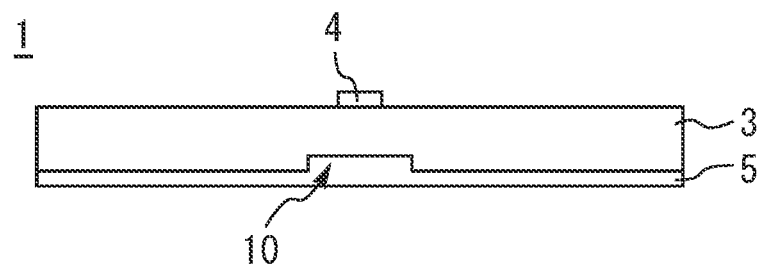
FIG. 17 is a cross-sectional view taken along I-II in FIG. 16.
Figure 18:
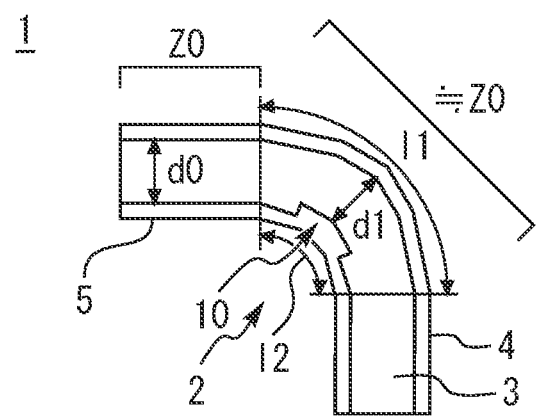
FIG. 18 is an enlarged cross-sectional view of the bending part of the flexible substrate according to Embodiment 4 being bent.

FIG. 16 is a perspective view illustrating a flexible substrate according to Embodiment 4. FIG. 17 is a cross-sectional view taken along I-II in FIG. 16. FIG. 18 is an enlarged cross-sectional view of the bending part of the flexible substrate according to Embodiment 4 being bent. A recess 10 facing the high-frequency signal line 4 is locally provided on the second main surface of the dielectric plate 3 only at the bending part 2. The ground conductor 5 is embedded in the recess 10.

When the flexible substrate 1 is bent, a length l1 of the high-frequency signal line 4 outside the bending part 2 largely extends as compared to a length l2 of the ground conductor 5 inside the bending part 2. When the bending part 2 has a small steepness and the bending part 2 has a relatively large bending region, influence of the extension of the high-frequency signal line 4 on the characteristic impedance is larger than influence of decrease of the thickness of the dielectric plate 3. Thus, contrariwise, the characteristic impedance may increase due to increase of the inductance at the bending part 2 in some cases.

However, in the present embodiment, the recess 10 is provided at the bending part 2 and embedded in the ground conductor 5. Accordingly, the distance between the high-frequency signal line 4 and the ground conductor 5 is shorter and the capacitance is larger at the bending part 2. With this structure, change of the local characteristic impedance of the bending part 2 relative to the characteristic impedance of the flat part 7 in the flexible substrate 1 is compensated. Thus, discontinuation between the characteristic impedance of the flat part 7 and the characteristic impedance of the bending part 2 in the flexible substrate 1 can be solved.

Optimum values need to be selected as the depth, size, and the like of the recess 10 in accordance with extension of the high-frequency signal line 4 due to bending (l1-l2), the change amount of the thickness of the dielectric plate 3 due to bending, the relative permittivity of the dielectric plate 3, the bending angle, the frequency of a propagating high-frequency signal, and the like.

Embodiment 5

Figure 19:
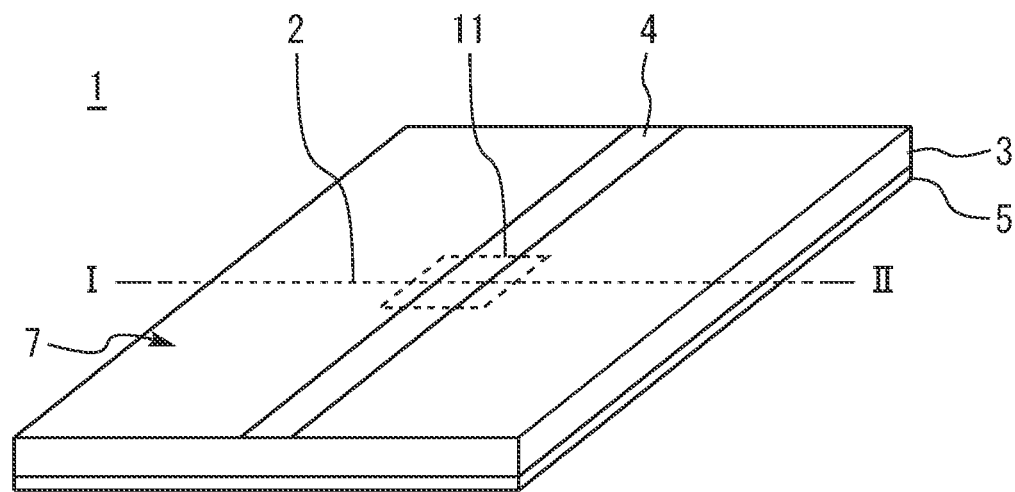
FIG. 19 is a perspective view illustrating a flexible substrate according to Embodiment 5.

FIG. 19 is a perspective view illustrating a flexible substrate according to Embodiment 5. A dielectric 11 having a permittivity different from the permittivity of the dielectric plate 3 is locally embedded in the dielectric plate 3 only at the bending part 2 in a region facing the high-frequency signal line 4. The second main surface of the dielectric plate 3 provided with the ground conductor 5 is dug to embed the dielectric 11, but the first main surface provided with the high-frequency signal line 4 may be dug to embed the dielectric 11.

When the characteristic impedance of the bending part 2 decreases due to bending, a material having a relative permittivity smaller than the relative permittivity of the dielectric plate 3 is selected as the material of the dielectric 11. When the characteristic impedance of the bending part 2 increases due to bending, a material having a relative permittivity larger than the relative permittivity of the dielectric plate 3 is selected as the material of the dielectric 11. With these structures, change of the local characteristic impedance of the bending part 2 relative to the characteristic impedance of the flat part 7 in the flexible substrate 1 is compensated. Thus, discontinuation between the characteristic impedance of the flat part 7 and the characteristic impedance of the bending part 2 in the flexible substrate 1 can be solved.

Optimum values need to be selected as the relative permittivity of the dielectric 11, the embedding depth of the dielectric 11, the size of the dielectric 11, and the like in accordance with the change amount of the thickness of the dielectric plate 3 due to bending, the relative permittivity of the dielectric plate 3, the bending angle, the frequency of a propagating high-frequency signal, and the like.

REFERENCE SIGNS LIST 1 flexible substrate; 2 bending part; 3 dielectric plate; 4 high-frequency signal line; 5 ground conductor; 6 absent part; 8 ground conductor, 10 recess; 11 dielectric

The invention claimed is:

1. A flexible substrate bent at a bending part comprising:
a dielectric plate having first and second main surfaces opposite to each other, a first flat part including first portions of the first and second main surfaces, respectively, and a second flat part including second portions of the first and second main surfaces, respectively;
a high-frequency signal line provided on the first main surface of the dielectric plate and extending along a longitudinal axis;
a ground conductor provided on the second main surface of the dielectric plate;
at least one additional ground conductor provided on at least one side of the high-frequency signal line at the bending part; and
at least one via penetrating through the dielectric plate to connect the at least one additional ground conductor to the ground conductor,
wherein the high-frequency signal line and the ground conductor form a micro strip line,
the bending part is defined by a single local absent part facing the high-frequency signal line and provided on the ground conductor only at the bending part which directly connects the first and second flat parts,
the absent part has a structure of a window shape in which the ground conductor is absent and is not covered with a conductor film, and
the at least one via is formed at a lateral axis that passes through the high-frequency signal line and the single local absent part.

2. The flexible substrate according to claim 1, wherein a change of a local characteristic impedance of the bending part relative to a characteristic impedance of a flat part of the flexible substrate is compensated.

3. The flexible substrate according to claim 1, wherein a width of the ground conductor is the same at the bending part as at portions other than the bending part.

* * * * *